(12) United States Patent
Pedersen

(10) Patent No.: US 7,249,339 B1
(45) Date of Patent: Jul. 24, 2007

(54) METHOD AND APPARATUS FOR OPTIMIZING DELAY PATHS THROUGH FIELD PROGRAMMABLE GATE ARRAYS

(75) Inventor: Bruce Pedersen, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 356 days.

(21) Appl. No.: 10/918,974

(22) Filed: Aug. 16, 2004

(51) Int. Cl.
*G06F 17/50* (2006.01)

(52) U.S. Cl. .............. 716/16; 716/2; 716/17; 716/18

(58) Field of Classification Search .......... 716/16, 716/17, 18, 2
See application file for complete search history.

(56) References Cited

U.S. PATENT DOCUMENTS

| | | | | |
|---|---|---|---|---|
| 5,706,473 A | * | 1/1998 | Yu et al. ..................... | 716/4 |
| 5,903,467 A | * | 5/1999 | Puri et al. .................. | 716/1 |
| 6,292,916 B1 | * | 9/2001 | Abramovici et al. ........ | 714/736 |
| 6,327,557 B1 | * | 12/2001 | Croix ........................ | 703/14 |
| 2002/0178432 A1 | * | 11/2002 | Kim et al. .................. | 716/18 |

* cited by examiner

*Primary Examiner*—Sun James Lin
(74) *Attorney, Agent, or Firm*—L. Cho

(57) ABSTRACT

A method for improving a design on a field programmable gate array (FPGA) includes modifying the design in response to a unate characteristic of an input to a node on the FPGA, and rising and falling delays of a node feeding the input.

26 Claims, 7 Drawing Sheets

US 7,249,339 B1

METHOD AND APPARATUS FOR OPTIMIZING DELAY PATHS THROUGH FIELD PROGRAMMABLE GATE ARRAYS

TECHNICAL FIELD

The present invention relates to the field of field programmable gate arrays (FPGAs). More specifically, the present invention relates to a method and apparatus for optimizing delay paths through FPGAs using tools such as electronic design automation (EDA) tools.

BACKGROUND

FPGAs are integrated circuits that include logic, processing, memory, and routing resources that may be programmed in the field after manufacture. FPGAs may be used to implement large systems that include millions of gates and megabits of embedded memory. At certain processing edges and operating conditions in FPGAs, the delay of falling edge signals, where a signal transitions from Vcc to ground (1 to 0), is often not the same as the delay of rising edge signals, where a signal transitions from ground to Vcc (0 to 1). This is due to the fact that in current CMOS processes the delay through a PMOS device is typically higher than the delay through an NMOS device. The differences in delay of rising and falling edge signals may pose to be a problem in instances where a signal though an FPGA transitions through an unbalanced number of rising and falling edges along a path. This could result in a propagation delay of the signal that is either much shorter or longer than expected.

One circuit design technique that has been used to address this problem involves changing the relative sizes of the PMOS and NMOS devices to equalize the delay of rising edge and falling edge signals under typical process and operating conditions, such as temperature and operating voltage. This approach, however, was effective at best only under selective processes and operating conditions. It was found that under other process corners and other operating conditions, the delay of rising and falling edge signals in a device could still be different and result in the same problem. Furthermore, this circuit design techniques suffered the additional drawback of increasing the average delay through a circuit, which is undesirable.

Thus, what is needed is an efficient method and apparatus for optimizing delay paths through FPGAs.

SUMMARY

According to an embodiment of the present invention, a design for a system is modified such that a number of rising and falling edge along a path is likely to be balanced. This approach allows circuit device-sizing techniques to be used to optimize average delay instead of equalizing the delay of rising and falling edges. In one embodiment, the design for the system is modified in response to a unate characteristic of an input to a node on the FPGA, and rising and falling delays of a node feeding the input.

BRIEF DESCRIPTION OF THE DRAWINGS

The features and advantages of the present invention are illustrated by way of example and are by no means intended to limit the scope of the present invention to the particular embodiments shown.

DETAILED DESCRIPTION

Figure 1:
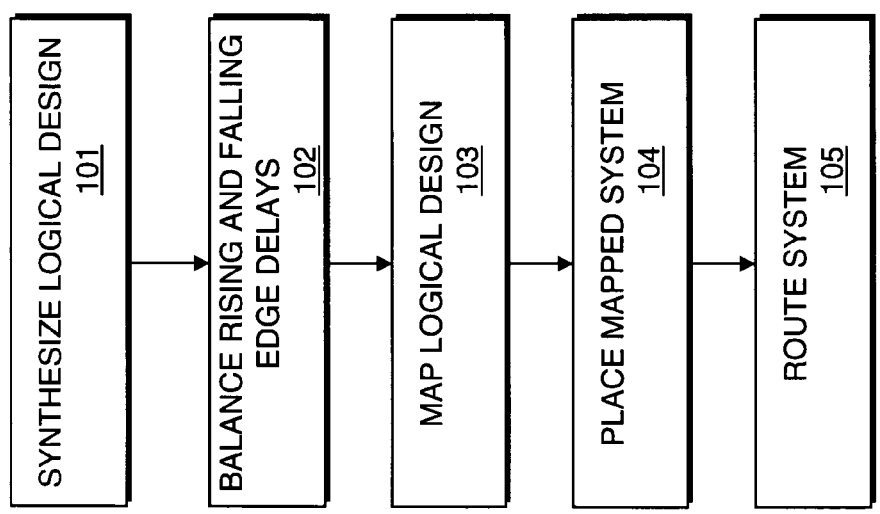
FIG. 1 is a flow chart illustrating a method for designing a system according to an embodiment of the present invention.

FIG. 1 is a flow chart that illustrates a method for designing a system according to an embodiment of the present invention. The method may be performed with the assistance of an EDA tool, for example. At 101, synthesis is performed. Synthesis includes generating a logic design of the system to be implemented by a target device. According to an embodiment of the present invention, synthesis generates an optimized logical representation of the system from a Hardware Description Language (HDL) design definition. The optimized logical representation of the system may include a representation that includes a minimized number of logic gates and logic elements required for the system. Alternatively, the optimized logical representation of the system may include a representation that has a reduced depth of logic and that generates a lower signal propagation delay.

Figure 2:
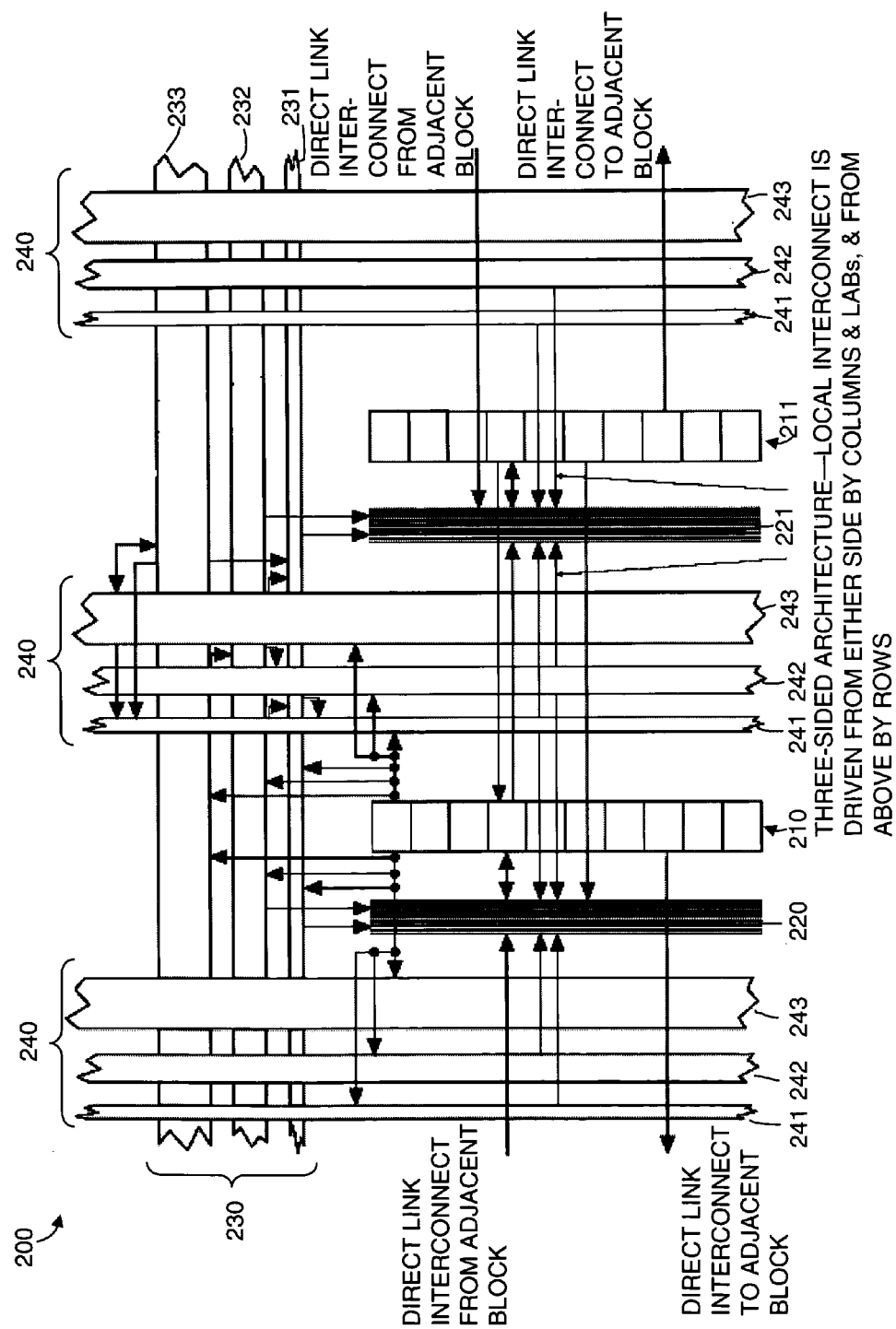
FIG. 2 illustrates a target device utilizing FPGAs according to an embodiment of the present invention.

FIG. 2 illustrates an exemplary target device 200 utilizing FPGAs according to an embodiment of the present invention. The present invention may be used to design a system onto the target device 200. According to one embodiment, the target device 200 is a chip having a hierarchical structure that may take advantage of wiring locality properties of circuits formed therein. The lowest level of the hierarchy is a logic element (LE) (not shown). An LE is a small unit of logic providing efficient implementation of user logic functions. According to one embodiment of the target device 200, an LE may include a 4-input lookup table (LUT) with a configurable flip-flop.

The target device 200 includes a plurality of logic-array blocks (LABs). Each LAB is formed from 10 LEs, LE carry chains, LAB control signals, LUT chain, and register chain connection lines. LUT chain connections transfer the output of one LE's LUT to the adjacent LE for fast sequential LUT connections within the same LAB. Register chain connection lines transfer the output of one LE's register to the adjacent LE's register within a LAB. LABs are grouped into rows and columns across the target device 200. A first column of LABs is shown as 210 and a second column of LABs is shown as 211.

The target device 200 includes memory blocks (not shown). The memory blocks may be, for example, dual port random access memory (RAM) blocks that provide dedicated true dual-port, simple dual-port, or single port memory up to various bits wide at up to various frequencies. The memory blocks may be grouped into columns across the target device in between selected LABs or located individually or in pairs within the target device 200.

The target device 200 includes digital signal processing (DSP) blocks (not shown). The DSP blocks may be used to implement multipliers of various configurations with add or subtract features. The DSP blocks include shift registers, multipliers, adders, and accumulators. The DSP blocks may be grouped into columns across the target device 200.

The target device 200 includes a plurality of input/output elements (IOEs) (not shown). Each IOE feeds an I/O pin (not shown) on the target device 200. The IOEs are located at the end of LAB rows and columns around the periphery of the target device 200. Each IOE includes a bidirectional I/O buffer and a plurality of registers for registering input, output, and output-enable signals. When used with dedicated clocks, the registers provide performance and interface support with external memory devices.

The target device 200 includes LAB local interconnect lines 220–221 that transfer signals between LEs in the same LAB. The LAB local interconnect lines are driven by column and row interconnects and LE outputs within the same LAB. Neighboring LABs, memory blocks, or DSP blocks may also drive the LAB local interconnect lines 220–221 through direct link connections.

The target device 200 also includes a plurality of row interconnect lines ("H-type wires") 230 that span fixed distances. Dedicated row interconnect lines 230, that include H4 231, H8 232, and H24 233 interconnects, route signals to and from LABs, DSP blocks, and memory blocks within the same row. The H4 231, H8 232, and H2 233 interconnects span a distance of up to four, eight, and twenty-four LABs respectively, and are used for fast row connections in a four-LAB, eight-LAB, and twenty-four-LAB region. The row interconnects 230 may drive and be driven by LABs, DSP blocks, RAM blocks, and horizontal IOEs.

The target device 200 also includes a plurality of column interconnect lines ("V-type wires") 240 that operate similarly to the row interconnect lines 230. The column interconnect lines 240 vertically routes signals to and from LABs, memory blocks, DSP blocks, and IOEs. Each column of LABs is served by a dedicated column interconnect, which vertically routes signals to and from LABs, memory blocks, DSP blocks, and IOEs. These column interconnect lines 240 include V4 241, V8 242, and V16 243 interconnects that traverse a distance of four, eight, and sixteen blocks respectively, in a vertical direction.

FIG. 2 illustrates an exemplary embodiment of a target device. It should be appreciated that a system may include a plurality of target devices, such as that illustrated in FIG. 2, cascaded together. It should also be appreciated that the target device may include programmable logic devices arranged in a manner different than that on the target device 200. A target device may also include FPGA resources other than those described in reference to the target device 200. Thus, while the invention described herein may be utilized on the architecture described in FIG. 2, it should be appreciated that it may also be utilized on different architectures, such as those employed by Altera® Corporation in its APEX™, and Mercury™ family of chips and those employed by Xilinx®, Inc. in its Virtex™ and Virtex™ II line of chips.

Referring back to FIG. 1, at 102, rising and falling edge delays are balanced. According to an embodiment of the present invention, the optimized logical representation generated at 101 may be further processed to optimize delay paths. Unate inputs to functions performed by one or more resources on the FPGA may be identified. Some of these functions may be modified such that the output of the functions is inverted with respect to the unate inputs. For example, if a LUT ("node") implements a selected function, the output of the LUT may reprogrammed to make the output of the LUT an inverting unate function of its unate inputs. It should be appreciated that a node may describe one or more LUTs implementing a function. By selectively inverting functions, the number of rising and falling edges on unate inputs along paths of a network may be better balanced. Although procedure 102 is shown separate from procedure 101, it should be appreciated that balancing rising and falling edge delays may also be performed during synthesis.

At 103, the optimized logical design of the signal is mapped. Mapping includes determining how to implement components such as logic gates and other logic components in the optimized logic representation with resources available on a target device. According to an embodiment of the present invention, a netlist is generated from mapping. The netlist illustrates how the resources of the target device are utilized to implement the system. The netlist may, for example, include a representation of the components on the target device and how the components are connected. Mapping may include, for example, determining how components may be implemented using LEs. The components may include, for example, digital logic such as logic gates, memory devices, and/or other components. Mapping may also include, for example, determining which LEs should be packed together in a LAB. Although the resources on a target device are assigned for implementing the components, the specific resources and their locations are not assigned in 103.

At 104, the mapped logical system design is placed. Placement includes fitting the system on the target device by determining which resources (and their location) on the target device is to be used for specific components and connections between the components. The placement procedure may be performed by a placer in an EDA tool that utilizes placement algorithms. According to an embodiment of the present invention, a user (designer) may provide input to the placer by specifying placement constraints. The constraints may include defining logic regions that group certain components of a system together. The size of the logic regions may be determined by the user or by a sizing method. The placement of the logic regions may be determined by the user or by a placement method.

At 105, routing of the system is performed. During routing, routing resources on the target device are allocated to provide interconnections between logic gates, logic elements, and other components on the target device. The routing procedure may be performed by a router in an EDA tool that utilizes routing algorithms.

Figure 3:
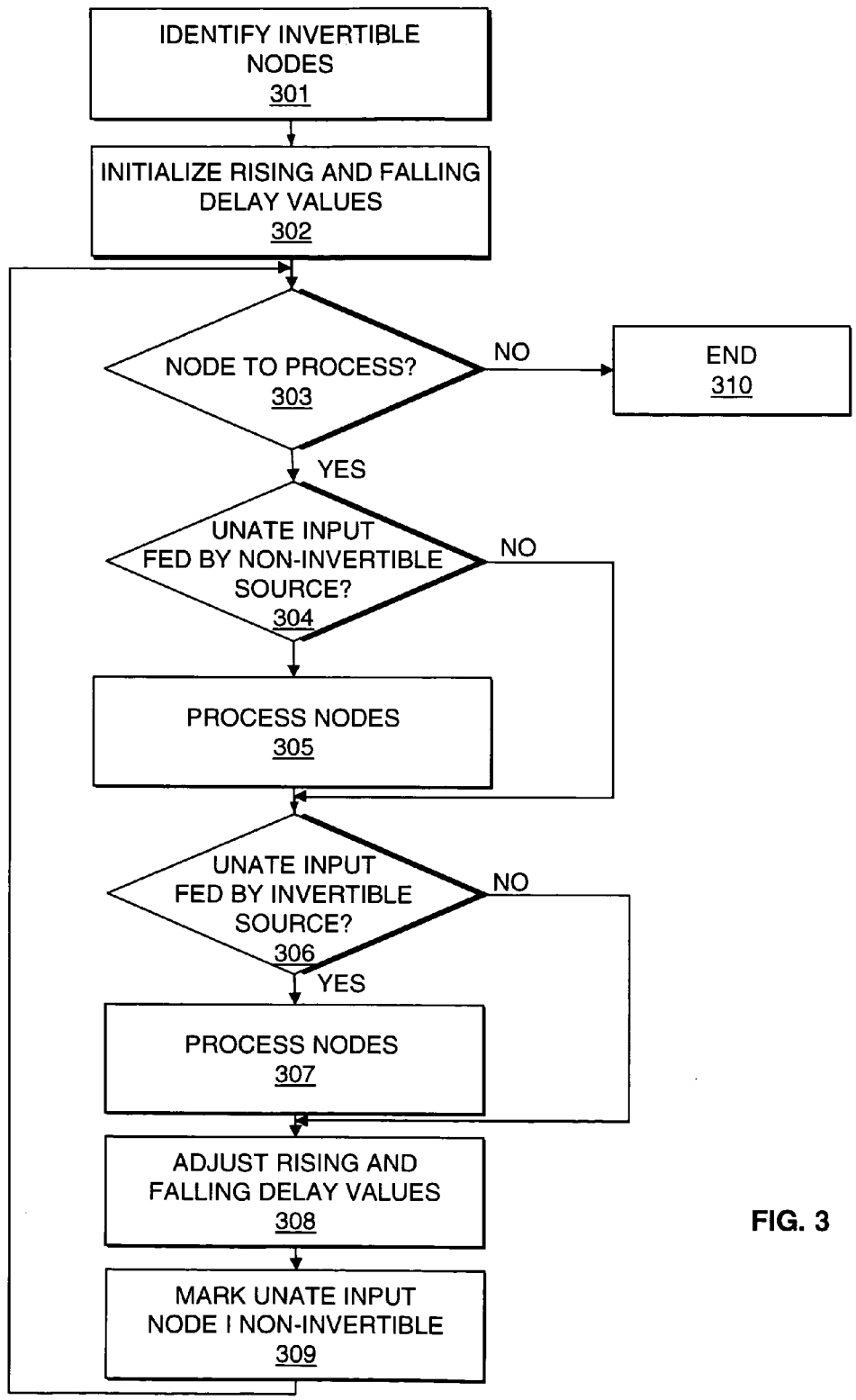
FIG. 3 is a flow chart illustrating a method for balancing rising and falling edge delays in an FPGA according to an embodiment of the present invention.

FIG. 3 is a flow chart illustrating a method for balancing rising and falling edge delays in an FPGA according to an embodiment of the present invention. The procedure shown in FIG. 3 may be used to implement the procedure 102 shown in FIG. 1. At 301, invertible nodes in a system are identified. The system may be a design for an FPGA such as the optimized logical representation generated at 101 (shown in FIG. 1). According to an embodiment of the present invention, an invertible node may be described as a node that feeds a LUT or other component that may be programmable to invert a signal. A non-invertible node may be described as a node that feeds a non-invertible primary output, such as an input to a register or a device output pin. The identified invertible nodes are marked in this procedure.

At 302, rising and falling edge delay values, $r_n$ and $f_n$, for the nodes of the system are initialized. The rising edge and falling edge delay values are associated with the amount of time required for a node to transition a signal from 0 to 1 and 1 to 0 states. According to an embodiment of the present invention, the rising and falling edge delay values, $r_n$ and $f_n$, for the nodes of the system are initialized to the average rising and falling delays for a typical wire, $D_r$ and $D_f$, coupled to an input of the node.

At 303, a next node in a depth-first order search through the nodes of the system is performed beginning at the inputs to locate a node j. It is determined whether a node j that has not been previously been processed is present. If a node j is present, control proceeds to 304. If a node j is not present, control proceeds to 310.

At 304, it is determined whether node j is an invertible node that has an input, i, that is unate and that is fed by a non-invertible source. If the node j is an invertible node that has a unate input that is fed by a non-invertible source, control proceeds to 305. If the node j is not an invertible node that has a unate input that is fed by a non-invertible source, control proceeds to 306. A unate input may be described as an input that can only result in one of either a rising output or a falling output when the input is a rising edge, if the input has any affect at all. A rising edge of a positive unate input can only result in a rising output if the input has any affect at all. A rising edge of a negative unate input can only result in a falling output if the input has any affect at all. Described mathematically, an input "a" to a function f(a,b,c,d) is said to be positive unate if f(a,b,c,d)=a AND f(1,b,c,d) OR f(0,b,c,d). An input "a" to a function f(a,b,c,d) is said to be negative unate if f(a,b,c,d)=f(1,b,c,d) OR !a AND f(0,b,c,d).

At 305, the node j is processed. According to an embodiment of the present invention, the rising and falling delay values of a node i feeding the most critical unate input i is evaluated. If the rising delay value of node i, $r_i$, is greater than the falling delay value of node i, $f_i$, and input i is positive unate, the output of node j is inverted and marked as non-invertible. If $r_i$ is less than $f_i$, and input i is negative unate, the output of node j is inverted and marked as invertible. Where the output of node j is inverted, the corresponding input of every destination fed by node j is inverted. According to an embodiment of the present invention, an input to a node (LUT) may be invertible. The LUT may be inverted by reprogramming the LUT's bitmask. The LUT's bitmask determines the LUT's functionality. Inverting a positive unate input transforms it into a negative unate input. Inverting a negative unate input transforms it into a positive unate input.

At 306, it is determined whether the node j has an input, i, that is unate and that is fed by an invertible source. If the node j has a unate input that is fed by an invertible source, control proceeds to 307. If the node j does not have a unate input that is fed by an invertible source, control proceeds to 308.

At 307, the node(s) feeding unate input(s) i are processed. For all unate inputs i fed by an invertible node i, the following procedure is performed. If $r_i$ is greater than $f_i$, and input i is a positive unate, the output of node i is inverted. If $r_i$ is less than $f_i$, and input i is negative unate, the output of node i is inverted. Where the output of node i is inverted, the corresponding input of every destination fed by node i is inverted.

At 308, the rising and falling delay values of the node j are adjusted in response to the unate characteristic of its inputs. The possible inversion of node j in 305 or the possible inversion of any unate input i at 307 may change whether a unate input i is either positive or negative. According to an embodiment of the present invention, for each input i feeding node j, the following adjustments are made to node j. If input i is positive unate, $r_j$=max ($r_i$+$D_r$, $r_j$), and $f_j$=max ($f_i$+$D_f$, $f_j$). If input i is negative unate, $r_j$=max ($f_i$+$D_r$, $r_j$), and $f_j$=max ($r_i$+$D_f$, $f_j$). If an input is not unate, $r_j$=$f_j$=max ($r_i$, $f_i$)+max ($D_r$, $D_f$).

At 309, every unate input node i is marked as non-invertible. Control returns to 303.

At 310, control terminates the process.

FIGS. 1 and 3 are flow charts illustrating embodiments of the present invention. Some of the techniques illustrated in these figures may be performed sequentially, in parallel or in an order other than that which is described. It should be appreciated that not all of the techniques described are required to be performed, that additional techniques may be added, and that some of the illustrated techniques may be substituted with other techniques.

Figure 4:
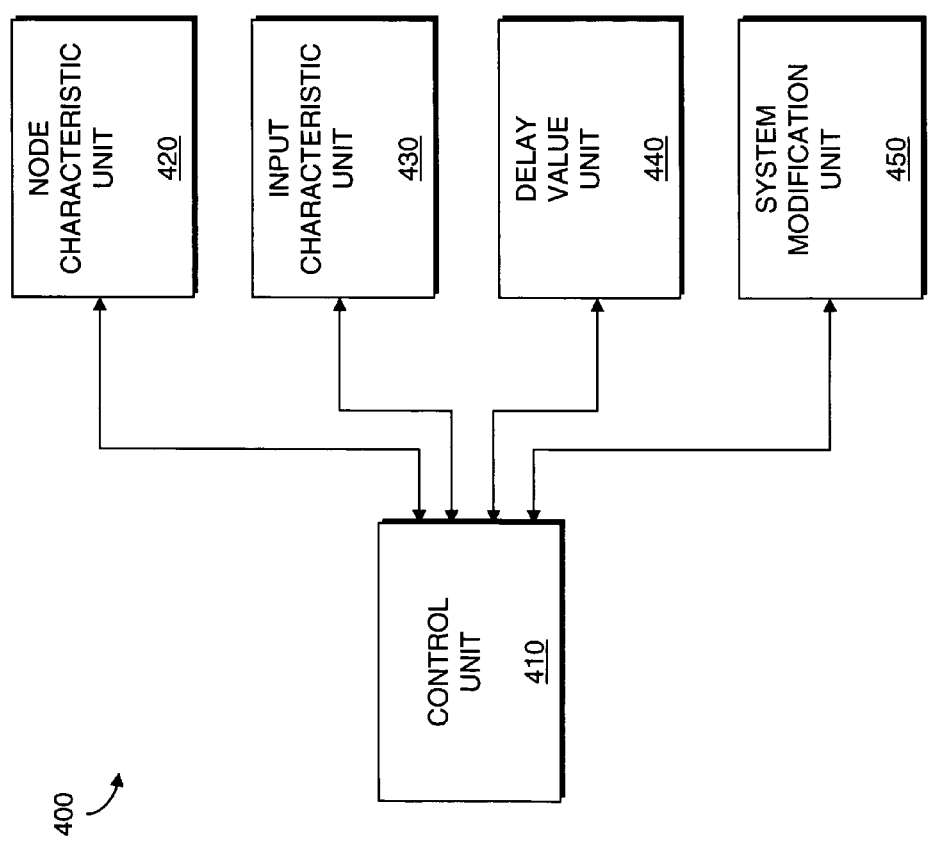
FIG. 4 is a block diagram illustrating a delay path optimization unit according to an embodiment of the present invention.

FIG. 4 is a block diagram illustrating a delay path optimization unit 400 according to an embodiment of the present invention. The delay path optimization unit 400 includes modules that may be included in an EDA tool. The modules may be implemented by software, hardware, or a combination of hardware and software. The delay path optimization unit 400 includes a control unit 410. The control unit 410 operates to manage data processed by each of the other components in the delay path optimization unit 400.

The delay path optimization unit 400 includes a node characteristic unit 420. The node characteristic unit 420 determines whether nodes in a system are invertible. The node characteristic unit 420 records the characteristic of the node and may updates a characteristic of a node.

The delay path optimization unit 400 includes an input characteristic unit 430. The input characteristic unit 430 determines unate characteristic of inputs to nodes in the system. A node may be characterized as being positive unate, negative unate, or not unate. The input characteristic unit 430 may determine a unate characteristic of inputs to nodes in the system by utilizing LUT masks, binary decision diagrams, or by using other techniques.

The delay path optimization unit 400 includes a delay value unit 440. The delay value unit 440 generates and stores rising and falling delay values, $r_n$ and $f_n$, of the nodes in the system. The delay value unit 440 may initialize the rising and falling delay values of the nodes in the system when the system is first analyzed. The rising and falling delay values may be initialized to delay values, $D_r$ and $D_f$, associated with wires feeding the node. The delay value unit 440 may also adjust the rising and falling delay values of the nodes based upon the unate characteristics of inputs to the nodes.

The delay path optimization unit 400 includes a system modification unit 450. The system modification unit 450 modifies the system in response to unate characteristics of inputs to the nodes and rising and falling delays of nodes feeding the inputs. By modifying the system, the system modification unit balances the number of rising edge and falling edge signals on paths in the system.

According to an embodiment of the delay path optimization unit 400, the control unit 410 identifies nodes, implemented by one or more LUTs, that have not yet been processed. For each node, j, the control unit 410 identifies whether the node j is invertible and has a most critical unate input, i, that is fed by a non-invertible source. The control unit 410 directs the system modification unit 450 to invert the output of the node j in response to a unate characteristic of the unate input i and the rising and falling delays of the node feeding the unate input i, node i. For example, if the rising delay of node i is greater than the falling delay of node i, and the unate input i is positive unate, the output of node j is inverted. If the rising delay of node i is less than the falling delay of node i, and the unate input i is negative, the output of node j is inverted. For each output of node j that is inverted, the control unit 410 directs the system modification unit 450 to invert the corresponding input of every destination fed by node j. The control unit 410 directs the node characteristic unit 420 to mark node j as non-invertible.

For each node, j, the control unit 410 also identifies all unate inputs i fed by an invertible source, node i. The control unit 410 directs the system modification unit 450 to invert the output of the node i in response to the unate characteristic of the unate input i and the rising and falling delays of node i. For example, if the rising delay of the node i is greater than the falling delay of node i, and the unate input i is positive unate, the output of the node i is inverted. If the rising delay of node i is less than the falling delay of node i, and the unate input i is negative, the output of node i is inverted. For each output of node i that is inverted, the control unit 410 directs the system modification unit 450 to invert the corresponding input of every destination fed by node i.

The control unit 410 also directs the delay value unit 440 to update the rising and falling delay of node j in response to the unate characteristic of all corresponding inputs. For example, if input i is positive unate, delay value unit 440 adjusts $r_j=\max(r_i+D_r, r_j)$, and $f_j=\max(f_i+D_f, f_j)$. If input i is negative unate, $r_j=\max(f_i+D_r, r_j)$, and $f_j=\max(r_i+D_f, f_j)$. If an input is not unate, $r_j=f_j=\max(r_i, f_j)+\max(D_r, D_f)$.

The control unit 410 directs the node characteristic unit 420 to mark every unate input node i as non-invertible before processing a next node.

Figure 5:
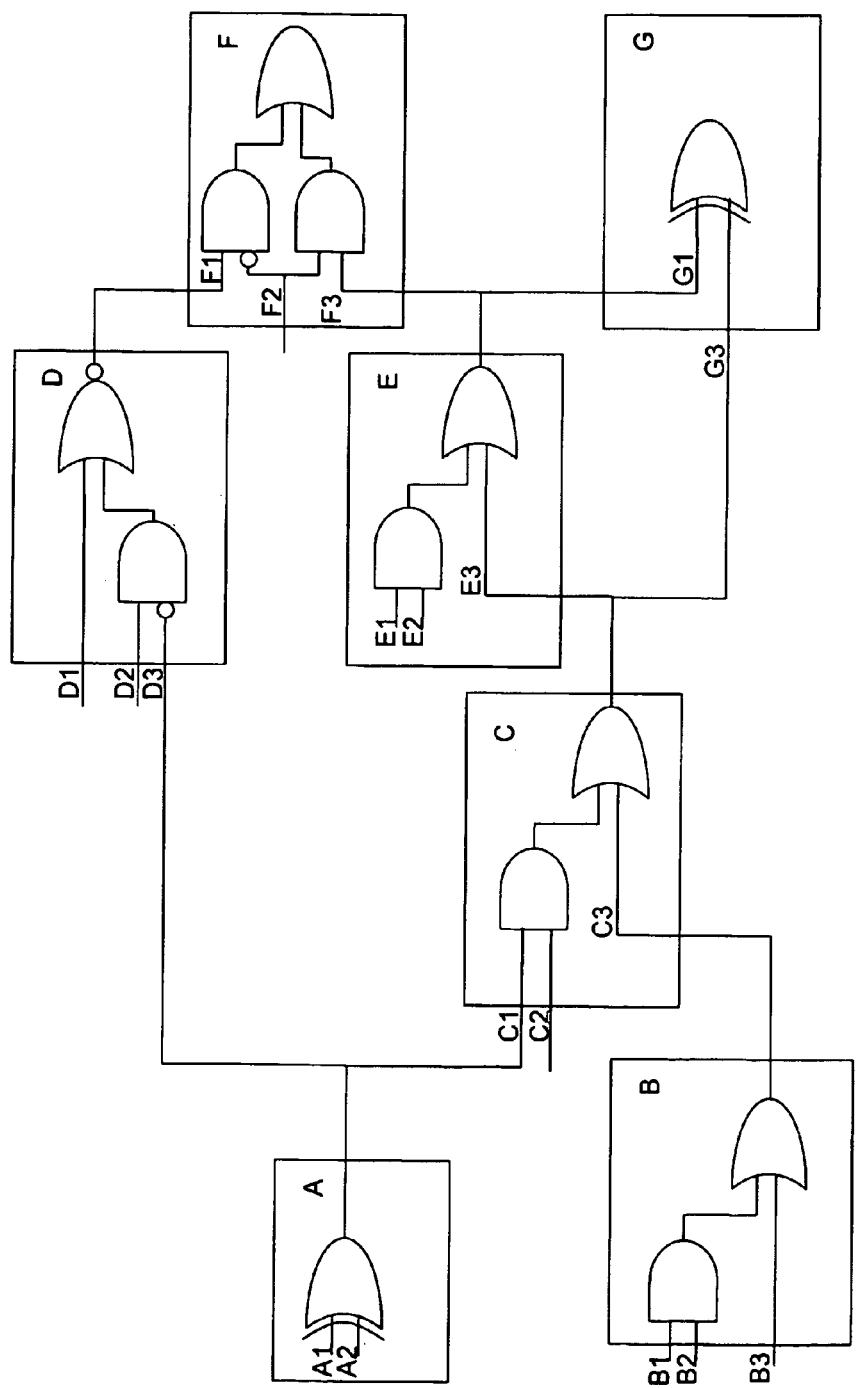
FIG. 5 illustrates an exemplary circuit according to an embodiment of the present invention.

FIG. 5 illustrates an exemplary circuit 500 according to an embodiment of the present invention. The circuit 500 may be processed to balance the rising and falling edge delays. With reference to FIG. 3, at 301, nodes in a system are identified. Nodes A, B, C, D, and E are determined to be invertible.

At 302, rising and falling edge delay values, $r_n$ and $f_n$, for the nodes of the system are initialized. According to an embodiment of the present invention, the rising and falling edge delay values, $r_n$ and $f_n$, for the nodes of the system are initialized to the average rising and falling delays for a typical wire, $D_r$ and $D_f$ coupled to an input of the node. In this example, $D_r$ is 0.75 and $D_f$ is 0.50.

At 303, a depth first search through the nodes of the system is performed beginning at the inputs. It is determined whether a node, j, that has not been previously processed is present. It is determined that node A is a node that has not been previously processed.

At 304, it is determined whether the node j is an invertible node that has an input, i, that is unate and that is fed by a non-invertible source. Since both inputs A1 and A2 are non-unate inputs, control proceeds to 306.

At 306, it is determined whether the node j has an input, i, that is unate and that is fed by an invertible source. Since both inputs A1 and A2 are non-unate inputs, control proceeds to 308.

At 308, the rising and falling delay values of the node j are adjusted in response to the unate characteristic of its inputs. For node A, since A1 and A2 are not unate, the following relationships are used. $r_j=f_j=\max(r_i, f_i)+\max(D_r, D_f)$. Since there are no rising and falling delay values for a node feeding inputs A1 and A2, the rising and falling delay values for node A are 0.75, and 0.75.

At 309, it is determined that there are no unate input node i to be marked as non-invertible. Control returns to 303.

At 303, a depth first search through the nodes of the system is performed beginning at the inputs. It is determined whether a node, j, that has not been previously processed is present. It is determined that node B is a node that has not been previously processed.

At 304, it is determined whether the node j is invertible and has an input, i, that is unate and that is fed by a non-invertible source. It is determined that node B is invertible and has inputs B1, B2, and B3 that are positive unate inputs that are fed by a non-invertible source. B1, B2, and B3 are driven by input pins which are non-invertible.

At 305, the node j is processed. B1, B2, and B3 are driven by input pins. Each input pin has its $r_n$ and $f_n$, initialized to the average rising and falling delays for a typical wire, 0.75 and 0.50 respectively. In this example, B1 is arbitrarily determined to be the most critical unate input. Since B1 is positive unate and the node feeding B1 has a rising delay value greater than its falling delay value, the output of node B is inverted and node B is marked as non-invertible. The corresponding input along C3 is also inverted.

At 306, it is determined whether the node j has an input, i, that is unate and that is fed by an invertible source. It is determined that node B does not have inputs that are unate and that are fed by an invertible source. Control proceeds to 308.

At 308, the rising and falling delay values of the node j are adjusted in response to the unate characteristic of its inputs. The three inputs to node B are positive unate and the relationships $r_j=\max(r_{i \text{ or } k}+D_r, r_j)$, and $f_j=\max(f_{i \text{ or } k}+D_f, f_j)$ are used. The rising and falling delay values for node A are 0.75, and 0.50.

At 309, it is determined that there are no unate input node i or k to be marked as non-invertible. Control returns to 303.

Figure 6:
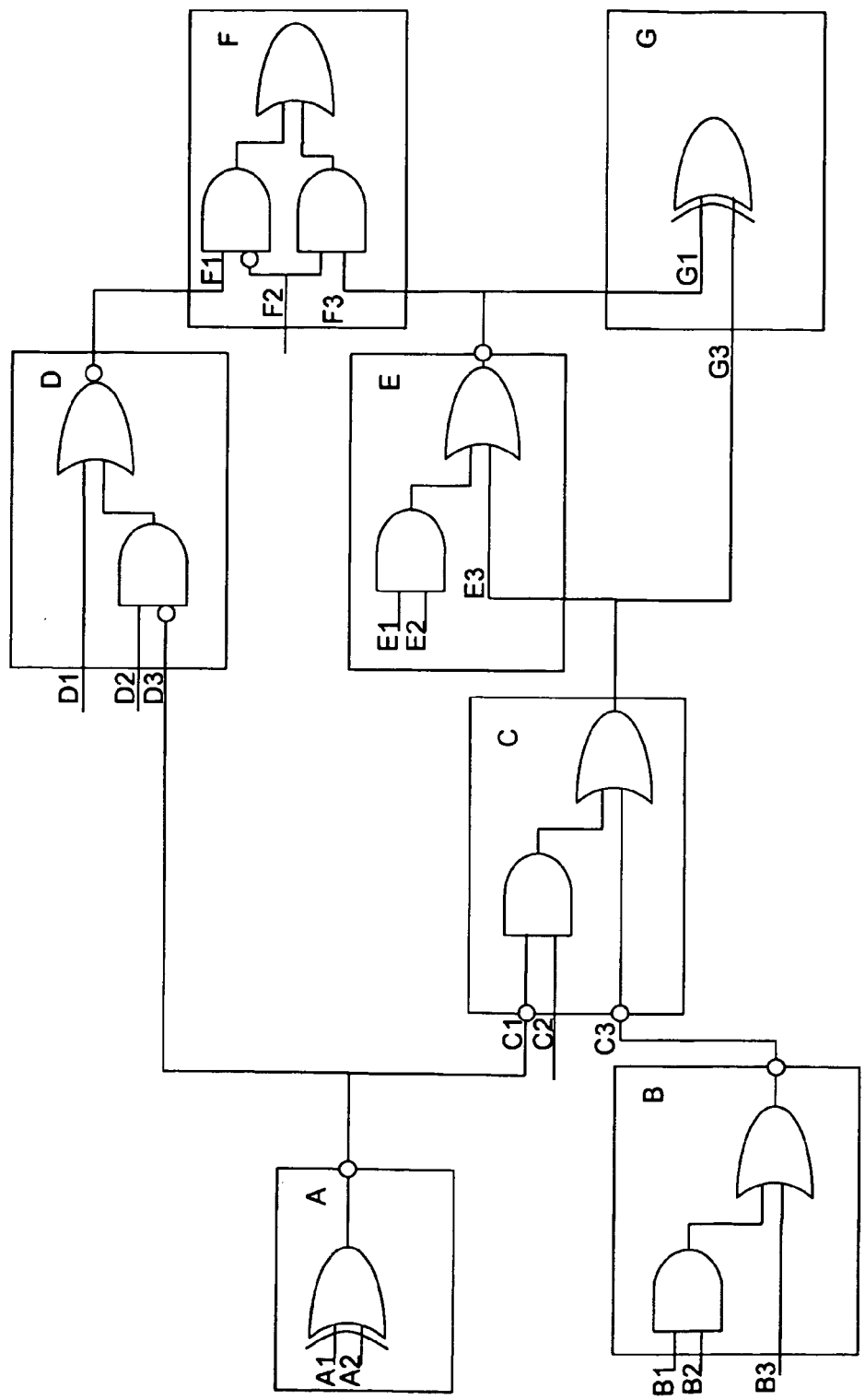
FIG. 6 illustrates the exemplary circuit shown in FIG. 5 with modifications performed according to an embodiment of the present invention after processing nodes A and B.
Figure 7:
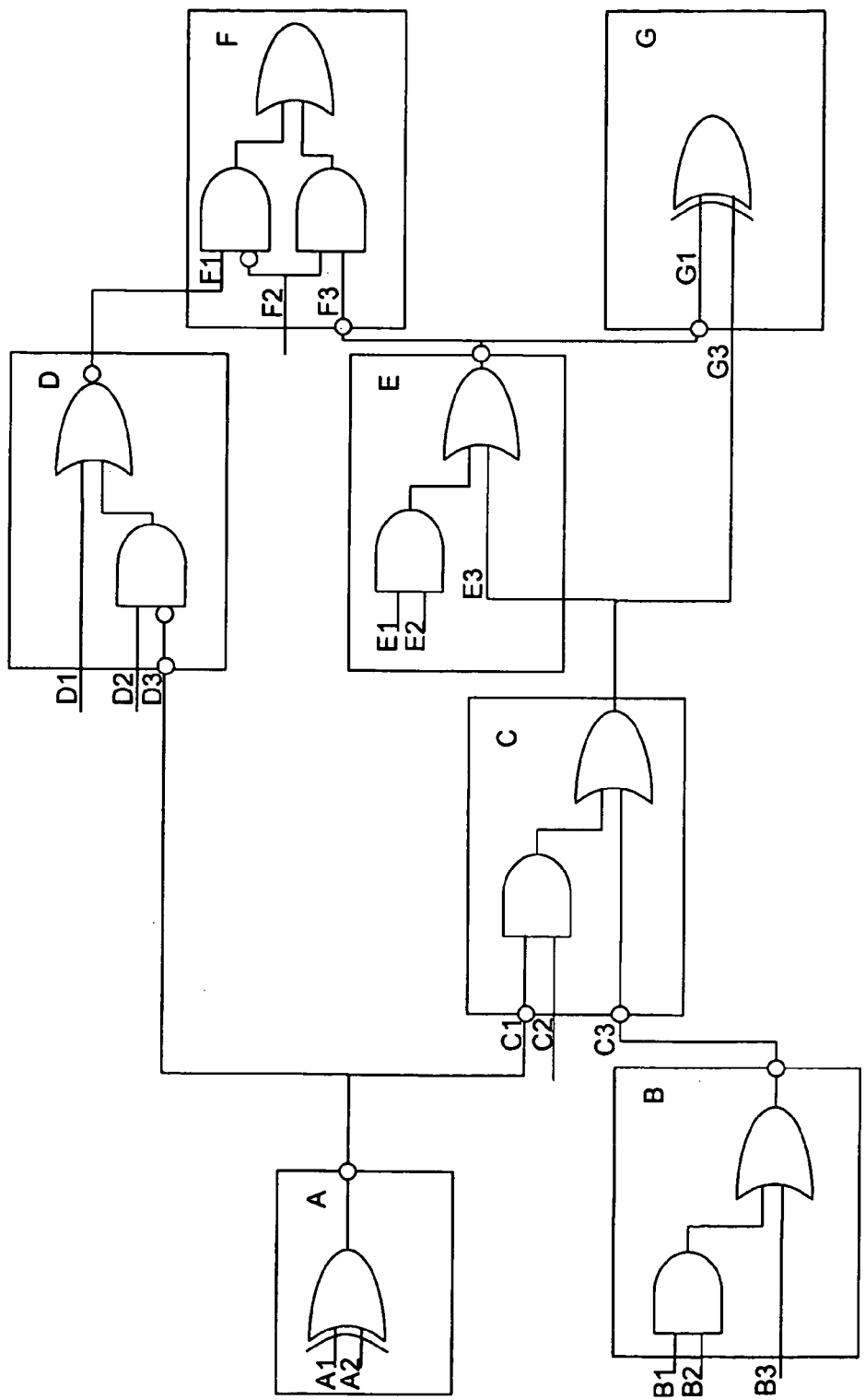
FIG. 7 illustrates the exemplary circuit shown in FIG. 5 with modifications performed according to an embodiment of the present invention after processing all the nodes.

FIG. 6 illustrates the exemplary circuit shown in FIG. 5 with modifications performed after processing nodes A and B as described above according to an embodiment of the present invention. FIG. 7 illustrates the exemplary circuit shown in FIG. 5 with modifications performed according to an embodiment of the present invention after all the nodes have been processed. As illustrated in FIGS. 6 and 7, the circuit shown in FIG. 5 has been modified to balance the rising and falling edge delays in order to improve the delay path through circuit. The rising and falling edge delays are balanced without modifying the functionality of the overall circuit by selectively inverting the outputs and inputs of nodes.

Embodiments of the present invention (e.g. exemplary process described with respect to FIGS. 1 and 3) may be provided as a computer program product, or software, that may include a machine-readable medium having stored thereon instructions. The machine-readable medium may be used to program a computer system or other electronic device. The machine-readable medium may include, but is not limited to, floppy diskettes, optical disks, CD-ROMs, and magneto-optical disks, ROMs, RAMs, EPROMs, EEPROMs, magnetic or optical cards, flash memory, or other type of media/machine-readable medium suitable for storing electronic instructions.

In the foregoing specification the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A method for improving a design on a field programmable gate array (FPGA), comprising:
modifying the design in response to a unate characteristic of an input to a node on the FPGA, and rising and falling delays of a node feeding the input in order to balance the rising and falling delays of the design.

2. The method of claim 1, wherein modifying the design comprises:
inverting a function of the node; and
inverting corresponding inputs fed by the node.

3. The method of claim 1, further comprising determining nodes on the FPGA that are invertible.

4. The method of claim 3, wherein determining the nodes on the FPGA that are invertible comprises identifying nodes that feed one of 1) a component having a programmable invert and 2) a lookup table.

5. The method of claim 1, further comprising assigning values corresponding to the rising and falling delays of nodes on the FPGA.

6. The method of claim 5, wherein assigning the values corresponding to the rising and falling delays of the nodes on the FPGA comprises designating average rising and falling delays for typical wires as the rising and falling delays of the nodes.

7. The method of claim 1, wherein modifying comprises:
identifying a most critical unate input that is fed by a non-invertible source for a node that is invertible;
inverting an output of the node in response to the unate characteristic of the input and rising and falling delays of a node feeding the input;
marking the node as non-invertible; and
marking a node that feeds the input as non-invertible.

8. The method of claim 7, wherein inverting comprises inverting the output of the node in response to the input being a positive unate and the rising delay being greater than the falling delay of the node feeding the input.

9. The method of claim 7, wherein inverting comprise inverting the output of the node in response to the input being a negative unate and the rising delay being less than the falling delay of the node feeding the input.

10. The method of claim 7, further comprising inverting an input of a destination fed by the node.

11. The method of claim 1, wherein modifying comprises:
identifying a unate input fed by an invertible source for a node;
inverting an output of a node feeding the input in response to the unate characteristic of the input and rising and falling delays of the node feeding the input; and
marking the node feeding the input as non-invertible.

12. The method of claim 11, wherein inverting comprises inverting the output of the node feeding the input in response to the input being a positive unate and the rising delay being greater than the falling delay of the node feeding the input.

13. The method of claim 11, wherein inverting comprise inverting the output of the node feeding the input in response to the input being a negative unate and the rising delay being less than the falling delay of the node feeding the input.

14. The method of claim 11, further comprising updating the rising and falling delays of the node in response to the unate characteristic of inputs to the node.

15. The method of claim 11, further comprising inverting an input of a destination fed by the node.

16. A machine-readable medium having stored thereon sequences of instructions, the sequences of instructions including instructions which, when executed by a processor, causes the processor to perform:
modifying a design on a field programmable gate array (FPGA) in response to a unate characteristic of an input to a node on the FPGA, and rising and falling delays of a node feeding the input in order to balance the rising and falling delays of the design.

17. The machine-readable medium of claim 16, wherein modifying the design comprises:
inverting a function of the node; and
inverting corresponding inputs fed by the node.

18. The machine-readable medium of claim 16, wherein modifying comprises:
identifying a most critical unate input that is fed by a non-invertible source for a node;
inverting an output of the node in response to the unate characteristic of the input and rising and falling delays of a node feeding the input;
marking the node as non-invertible; and
marking a node that feeds the input as non-invertible.

19. The machine-readable medium of claim 16, wherein modifying comprises:
identifying a unate input fed by an invertible source for a node that is invertible;
inverting an output of a node feeding the input in response to the unate characteristic of the input and rising and falling delays of the node feeding the input; and
marking the node feeding the input as non-invertible.

20. A delay path optimization unit, comprising:
an input characteristic unit that determines unate characteristics of inputs to nodes in a system;
a delay value unit that determines rising and falling delay values of the nodes in the system; and
a system modification unit that modifies the system in response to the unate characteristics of inputs to the nodes, and rising and falling delays of nodes feeding the inputs in order to balance the rising and falling delays of the system.

21. The apparatus of claim 20, further comprising a node characteristic unit that determines whether the nodes in the system are invertible.

22. The apparatus of claim 20, further comprising a control unit that identifies a most critical unate input that is fed by a non-invertible source for a node that is invertible, and that inverts an output of the node in response to a unate characteristic of the input and rising and falling delays of a node feeding the input.

23. The apparatus of claim 22, wherein the control unit prompts a node characteristic unit to mark the node as non-invertible, and mark a node that feeds the input as non-invertible.

24. The apparatus of claim 20, further comprising a control unit that identifies a unate input fed by an invertible source for a node, and that inverts an output of a node feeding the input in response to a unate characteristic of the input and rising and falling delays of the node feeding the input.

25. The apparatus of claim 24, wherein the control unit prompts a node characteristic unit to mark the node feeding the input as non-invertible.

26. The apparatus of claim 20, wherein the delay value unit updates the rising and falling delays of the node in response to the unate characteristic of inputs to the node.

* * * * *